(12) United States Patent
Azizi

(10) Patent No.: US 7,668,237 B2
(45) Date of Patent: Feb. 23, 2010

(54) EQUALIZER CONTAINING A PLURALITY OF INTERFERENCE CORRECTING EQUALIZER SECTIONS

(75) Inventor: Seyed Ali Azizi, Eningen (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 10 days.

(21) Appl. No.: 11/566,500

(22) Filed: Dec. 4, 2006

(65) Prior Publication Data

US 2007/0195873 A1 Aug. 23, 2007

Related U.S. Application Data

(63) Continuation of application No. 10/081,868, filed on Feb. 22, 2002, now Pat. No. 7,145,944.

(51) Int. Cl.
   *H03H 7/40* (2006.01)
   *G06F 17/10* (2006.01)
   *H03K 5/00* (2006.01)
   *H04B 1/10* (2006.01)

(52) U.S. Cl. ............... 375/229; 375/232; 375/230; 708/322; 708/323; 327/552; 327/553

(58) Field of Classification Search ......... 375/229–236; 327/552–559; 708/300–301, 322–323, 314
See application file for complete search history.

(56) References Cited

U.S. PATENT DOCUMENTS

| | | | |
|---|---|---|---|
| 3,715,691 A | 2/1973 | Kurth | |
| 4,686,686 A * | 8/1987 | Nakayama et al. | 375/229 |
| 4,868,850 A * | 9/1989 | Kaku et al. | 375/231 |
| 4,939,782 A | 7/1990 | Gambacurta et al. | |
| 5,617,480 A | 4/1997 | Ballard et al. | |
| 5,714,918 A | 2/1998 | Menkoff | |
| 5,841,810 A * | 11/1998 | Wong et al. | 375/232 |
| 5,872,851 A | 2/1999 | Petroff | |
| 5,892,412 A | 4/1999 | Norte et al. | |
| 7,505,520 B2 * | 3/2009 | Kudoh | 375/257 |
| 7,548,790 B1 * | 6/2009 | Johnston et al. | 700/94 |
| 2004/0198414 A1* | 10/2004 | Hunton | 455/550.1 |
| 2007/0153945 A1* | 7/2007 | Gupta | 375/346 |

OTHER PUBLICATIONS

Drew's Equalizer and Frequency Equalization Tutorial—The More You Know, The Better it Sounds, DAK Inc. 1999-2005.
Basic Car Audio Electronics, Perry Babin, 1998-2003.
Matsuda, Yoshiaki e tal., Development of Parametric Equalizer LSI, IEEE Transactions on Consumer Electronics, vol. 36, No. 3, pp. 354-359, Aug. 1990.

\* cited by examiner

*Primary Examiner*—David C Payne
*Assistant Examiner*—Linda Wong
(74) *Attorney, Agent, or Firm*—O'Shea Getz P.C.

(57) ABSTRACT

An equalizer includes at least two first mutually interfering equalizer sections, and at least two second interference-correcting equalizer sections, arranged in series. Each of the second equalizer sections corresponds with one first equalizer section, such that although each corresponding equalizer has the same center frequency, the second equalizer sections have an equalization response opposite the interference effect, and the gain of the corresponding second equalizer at the respective common center frequency contains the negative gain of at least one first equalizer adjacent to the corresponding first equalizer at the center frequency of the corresponding first equalizer.

4 Claims, 6 Drawing Sheets

EQUALIZER CONTAINING A PLURALITY OF INTERFERENCE CORRECTING EQUALIZER SECTIONS

PRIORITY INFORMATION

This application is a continuation of Ser. No. 10/081,868 filed Feb. 22, 2002 now U.S. Pat. No. 7,145,944.

BACKGROUND OF THE INVENTION

The present invention relates to the field of equalizers, and in particular to an equalizer that includes a plurality of sections tuned to reduce interference between various sections of the equalizer.

Equalizer arrangements such as equalizer banks comprise a set of equalizers that are interconnected in a certain way using a serial, parallel, or any other structure. The individual equalizers may be presence (+) equalizers or absence (−) equalizers, that is, equalizers with an increase of gain or a decrease of gain (increased attenuation) at the relevant center frequency. The attenuation dimension in the following discussion shall be indicated in dB as a negative gain dimension.

An inherent problem in equalizer banks is the fact that the response characteristic of the individual equalizers within the equalizer bank mutually interferes, creating at least two highly undesirable disadvantages for conventional equalizer banks. First, depending on the setting at certain frequencies and frequency ranges, pronounced gain peaks or attenuation peaks may arise. A second problem is that more or less pronounced distortion of the response characteristic may occur.

Therefore, there is a need for an equalizer that reduces the undesirable interference between the equalizer sections.

SUMMARY OF THE INVENTION

An equalizer receives an input signal and provides an equalizer output signal that includes a first equalizer bank and a second equalizer bank. The first equalizer bank includes a first equalizer section that receives the input signal. The first equalizer section has a gain and provides a first equalizer output signal to a second equalizer section having a center frequency. The second equalizer section provides a second equalizer output signal to a third equalizer section that has a gain and provides a third equalizer output signal. The second equalizer bank includes a first correcting equalizer section that receives a signal indicative of the third equalizer output signal and provides a first correcting equalizer output signal to a second correcting equalizer section. The second correcting equalizer section provides a second correcting equalizer output signal to a third correcting equalizer section, which provides the equalizer output signal. The second correcting equalizer section includes a gain value that is indicative of the negative sum of the gains associated with the first and third equalizer sections of the first bank at the center frequency of the second equalizer section of the first bank.

An equalizer according to the present invention reduces the amount of interference between equalizer sections by taking into account the interfering effect of at least one adjacent equalizer section, preferably of the two adjacent equalizer sections, at the center frequency of the respective equalizer section. The equalizer determines the interfering effect of each individual equalizer section on its adjacent equalizer sections at the center frequency of the latter, and derives correction values from this. Corresponding correction equalizer sections with the opposite response are then driven using these correction values to compensate for the interfering effects.

An equalizer arrangement comprises at least two first equalizer sections and at least two second equalizer sections (correction equalizers) that are connected in series. In each case one second equalizer section corresponds with one first equalizer section, such that while the corresponding first and second equalizer sections have the same center frequency, the corresponding second equalizer sections exhibit an equalization response that at least partially compensates for the interference. The gain of each corresponding second equalizer section at the relevant common center frequency is equal to the negative sum of the gain of at least one first equalizer section adjacent to the corresponding first equalizer section at the center frequency of the corresponding first equalizer section.

The gain of each equalizer section of the equalizer is calculated or estimated at the center frequency of at least one adjacent equalizer section. This gain is then used to adjust the correction equalizer sections corresponding to the adjacent equalizer sections. The gain values so determined (in dB) may thus be added up with the correct sign for each individual center frequency so as to provide a certain gain value section (or attenuation value) for each corresponding equalizer (correction equalizer) at each center frequency. The gain for each corresponding second equalizer section (correction equalizer) is equal to the negative interference value calculated for the corresponding first equalizer section at its center frequency.

In addition to gain, the phase position at each respective center frequency may also be taken into account, which permits a complex calculation rather than a purely real calculation.

The gain of each second equalizer section is preferably composed of the negative gains from the first equalizer section preceding the corresponding first equalizer section and from the first equalizer section following the corresponding first equalizer section at the center frequency of the corresponding first equalizer section. In addition, the gain of each second (i.e., correction) equalizer section may also contain the negative gains of additional adjacent first equalizer sections at the center frequency of the corresponding first equalizer section.

The arrangement of the equalizers may be such that either the first equalizer sections are each connected immediately adjacent in series or the second equalizer sections are each connected immediately in series. In an alternative embodiment, first and second equalizer sections may be connected immediately adjacent in series.

Preferably, the first and second equalizer sections each have an essentially constant specified gain (e.g., the gain 1 corresponding to 0 dB) which, however, is raised or lowered relative to the essentially constant value in the center-frequency range. The center frequency may either be fixed (graphic equalizer bank) or modifiable (parametric equalizer bank). In the case of parametric equalizers, other characteristics of the response characteristic may also be adjustable.

These and other objects, features and advantages of the present invention will become more apparent in light of the following detailed description of preferred embodiments thereof, as illustrated in the accompanying drawings.

DETAILED DESCRIPTION OF THE INVENTION

Figure 1:
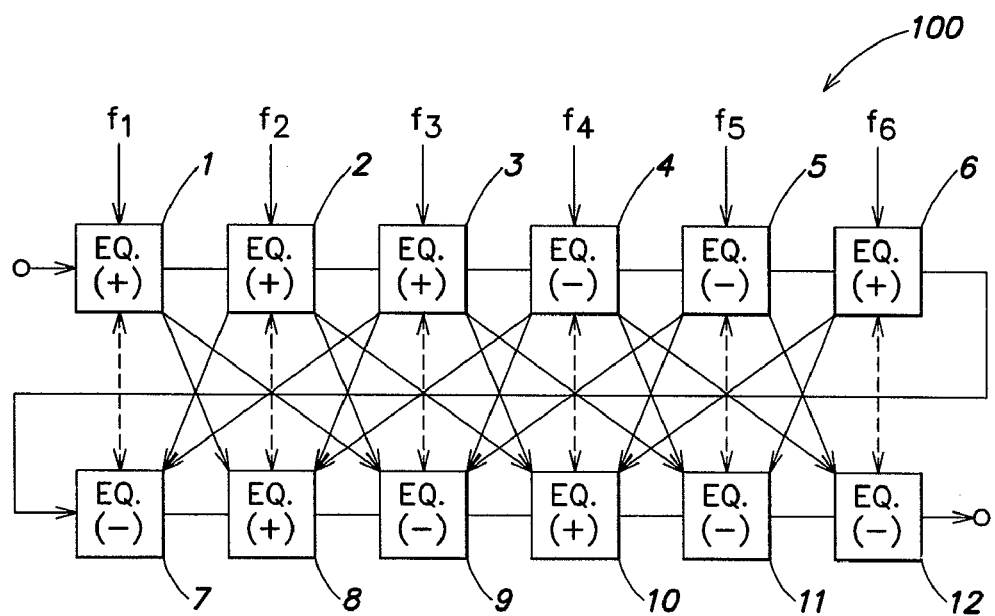
FIG. 1 is a block diagram illustration of a serial equalizer arrangement configured as a parametric equalizer.

FIG. 1 is a block diagram illustration of a serial equalizer arrangement 100 configured as a parametric equalizer. The serial equalizer 100 includes a first equalizer bank having six equalizer sections 1-6. The first equalizer bank sections 1-6 have center frequencies $f_1$-$f_6$, respectively, which establish the response characteristic of the entire serial equalizer arrangement 100. The serial equalizer arrangement 100 also includes a second equalizer bank that includes six second equalizer sections 7-12. Each of the second equalizer bank sections 7-12 are arranged in serial and have the same center frequency $f_1$-$f_6$ of a uniquely associated one of the first equalizer bank sections 1-6. In this embodiment, the center frequency values $f_1$-$f_6$ are variable (e.g., dynamically adjustable) to provide a parametric equalizer.

Each of the second equalizer bank sections 7-12 has an equalization response that is opposite the interference effects on its corresponding first equalizer bank section 1-6 produced by the adjacent first equalizer bank section. For example, the specific first equalizer bank sections 1, 2, 3, 6 are presence (+) equalizers, while the specific first equalizer bank sections 4, 5 are absence (−) equalizers. Opposing these, the specific second equalizer bank sections 8, 10 are presence equalizers, while the specific second equalizer bank sections 7, 9, 11, 12 are absence equalizers, corresponding to the interference effect of the first equalizer bank sections adjacent to the corresponding first equalizer bank sections.

With respect to the base gain, in general the presence equalizers increase the gain at the relevant center frequency while the absence equalizers lower the gain at the center frequency. The mode of operation for absence equalizers and presence equalizers is presented in more detail in FIGS. 3A-3C.

The gain (+) or attenuation (−) of the second equalizer bank sections 7-12 designed as presence equalizers or absence equalizers is derived from the interference (crosstalk) of the first equalizer bank sections that are adjacent to each corresponding first equalizer bank section at the common center frequency $f_1$-$f_6$ of the corresponding first equalizer bank section. In one embodiment, the two first equalizer bank sections, if present, which are each adjacent on both sides of a corresponding first equalizer bank section, are evaluated to compute values for the corresponding second equalizer bank sections 7-12.

In the case of the specific first equalizer bank section 1, there are only two adjacent first equalizer bank sections, namely, first equalizer bank sections 2 and 3, which are located on the upstream side of first equalizer bank section 1. Based on its equalization response that is opposite the respective total crosstalk, the second equalizer bank section 7, corresponding to the first equalizer bank section 1, emulates the effect of the two adjacent first equalizer bank sections 2 and 3 at the center frequency $f_1$ of the two corresponding first and second equalizer bank sections 1 and 7 in complementary fashion such that the effect of the two first equalizer bank sections 2 and 3 on the first equalizer bank section 1 is compensated. The amount of the attenuation of the second equalizer bank section 7 corresponds to the amount of gain at the center frequency $f_1$, which is produced by the two first equalizer bank sections 2 and 3.

At the center frequency $f_3$ of the first equalizer section 3, for example, first equalizer bank sections 1 and 2 also act before the first equalizer bank section 3, while the first equalizer bank sections 4 and 5 do so after the first equalizer bank section 3. The effect of the first equalizer bank section 6 that is three places removed from the first equalizer bank section 3 is negligible here. Corresponding to the first equalizer bank section 3 is the correcting second equalizer bank section 9, which serves to compensate for the effect of the first equalizer bank sections 1, 2, 4 and 5. The amount of attenuation of the correcting second equalizer bank section 9 is equal to the amount of gain at the common center frequency $f_3$ produced in common by the first equalizer bank sections 1, 2, 4 and 5 at the center frequency $f_3$. The compensation at the remaining center frequencies $f_2$, $f_4$, $f_5$ and $f_6$ is effected analogously.

The gains or attenuations of the correcting second equalizer bank sections 7-12 may be calculated or estimated from the transfer function of the associated adjacent first equalizer bank sections 1-6, or by measurement of the signals produced by the associated adjacent first equalizer bank sections 1-6 at the respective center frequency.

Figure 2:
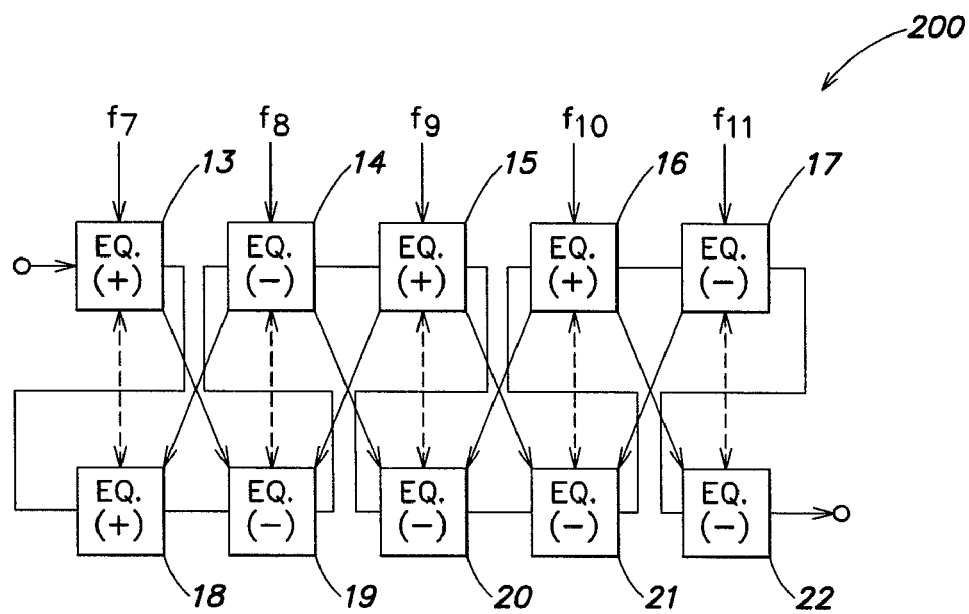
FIG. 2 is a block diagram illustration of a serial equalizer arrangement configured as a graphic equalizer bank.

FIG. 2 is a block diagram illustration of a serial equalizer arrangement 200 configured as a graphic equalizer bank. The graphic equalizer bank includes five first equalizer sections 13-17 as well as five second equalizer sections 18-22. Each of the first equalizer sections includes a corresponding second equalizer section. The corresponding first and second equalizer sections have the same center frequency. The equalization response of the second equalizer sections is determined from the interference effect at the respective center frequency. The first and second equalizer sections 13-22 are arranged such that the corresponding first and second equalizer sections immediately follow each other, and the pairs of corresponding equalizer sections 13-22 are connected in series. Since this embodiment is configured as a graphic equalizer bank, the center frequencies $f_7$-$f_{11}$ are fixed. In this case, the second equalizer sections 18-22 may be permanently adjusted to the respective corresponding first equalizer sections 13-17 and their adjacent first equalizer sections. That is, the second equalizer sections 18-22 may also be designed as fixed (preferably identical) equalizers.

In the embodiment of FIG. 2, only the immediately adjacent first equalizer sections 13-17 are evaluated for interference compensation. For example, the effect of the first equalizer sections 14, 16 adjacent to the first equalizer section 15 may be expressed here formally—as illustrated in the following discussion.

In this embodiment the output variables may include: the respective gains $G_1$ (in dB) of the first equalizer sections 13-17, the respective quality $Q_i$ of first equalizer sections 13-17 or the gains $G_k$ (in dB) of second equalizer sections 18-22 or the respective quality $Q_k$ of second equalizer sections 18-22, the respective center frequency $f_i$ of the first equalizer sections 13-17 or the respective center frequency $f_k$ of second equalizer sections 18-22 as well as the value $K_{ji}$ (in dB) corresponding to the gain of the first equalizer section 13-17 with a center frequency $f_j$ at the center frequency $f_i$ and thus the crosstalk (interference) of an equalizer section with center frequency $f_j$ affecting the first equalizer section with center frequency $f_i$.

The total crosstalk $K_i$ from the two adjacent channels $j=i+1$ and $j=i-1$ can be expressed as:

$$K_i = K_{(i+1)} + K_{(i-1)}$$

The gain of the second equalizer section k corresponding to first equalizer section i is thus:

$$G_k = -K_i$$

Otherwise the following applies for two corresponding first and second equalizer sections i and k where $f_i = f_k$:

$$Q_k = \alpha \cdot Q_i \text{ where } 0.5 \leq \alpha \leq 2$$

Figure 3A:
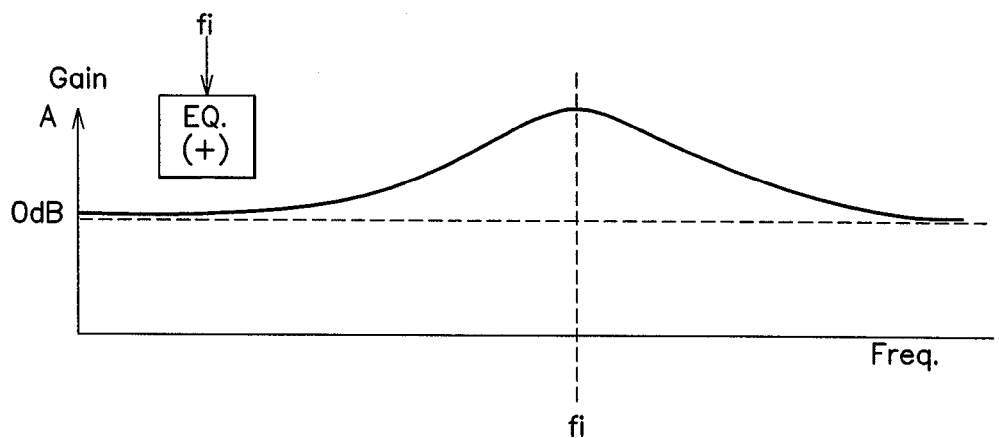
FIGS. 3A-3C are plots of response characteristics of the equalizers illustrated in FIGS. 1 and 2.
Figure 3B:
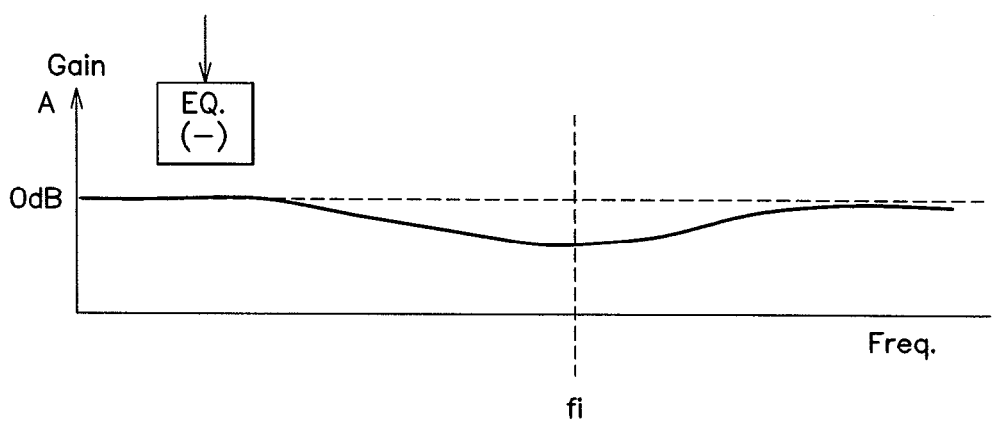

FIG. 3A is a plot of a characteristic curve of a single first equalizer section located within an equalizer bank, the crosstalk of adjacent equalizer sections being contained in schematic form in the characteristic curve shown (gain peaking). FIG. 3B shows the characteristic curve for the gain A (in dB) as a function of the frequency f of a second equalizer section (correction equalizer) corresponding to the first equalizer section shown in FIG. 3A, the characteristic curve of this correction equalizer corresponding to the opposite characteristic curve of the crosstalk produced by the adjacent first equalizer sections in the corresponding first equalizer section.

Figure 3C:
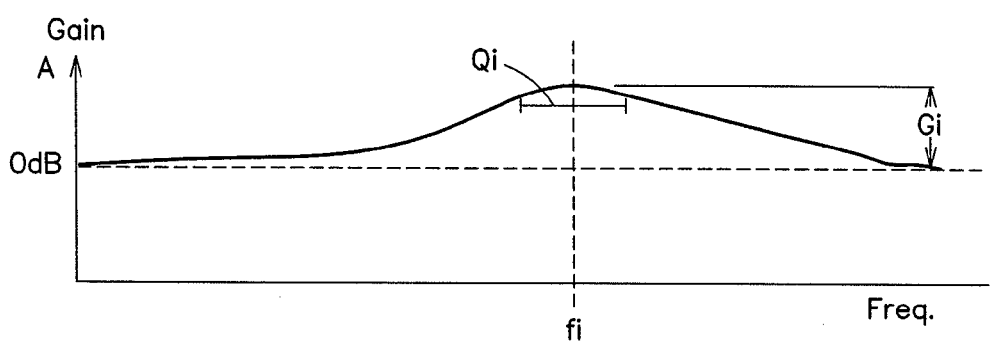

Connecting the corresponding first and second equalizer sections in series results in a total characteristic curve that is shown in FIG. 3C. This characteristic curve matches the adjusted and thus desired characteristic curve since the effect of the adjacent equalizer sections is compensated. The characteristic curve is characterized by the center frequency $f_i$, the quality $Q_i$, and the gain $G_i$ at the center frequency $f_i$.

Figure 4A:
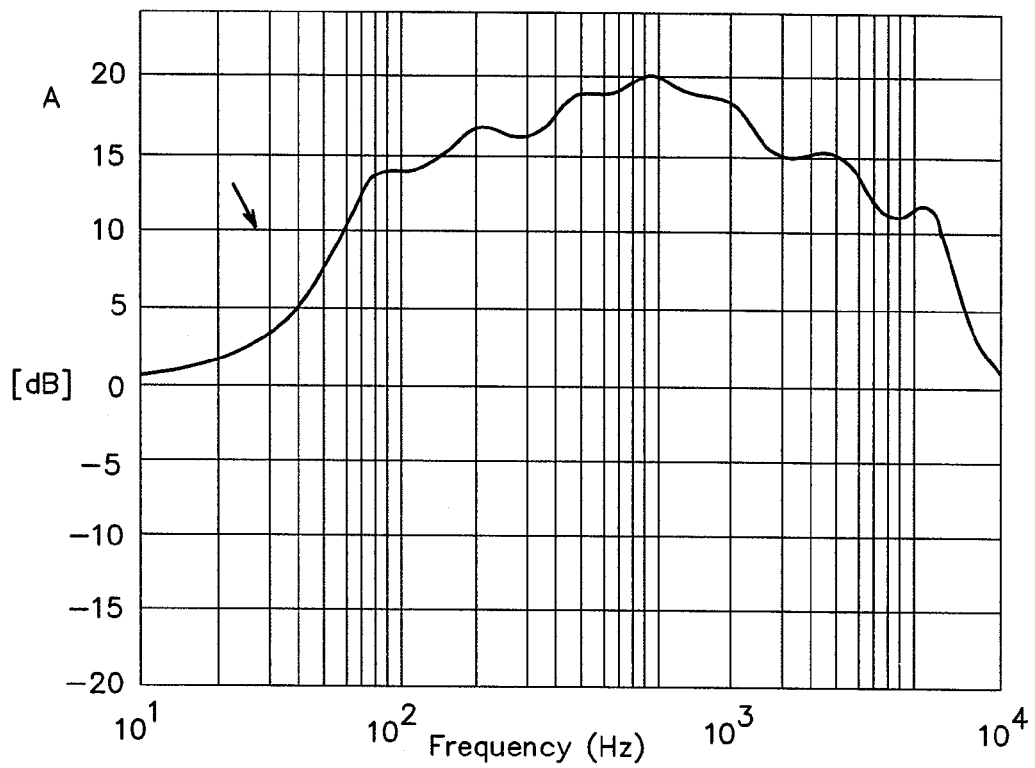
FIGS. 4A, 4B, 5A, 5B, 6A and 6B are plots of the response characteristic of the improved equalizer arrangements in comparison with conventional equalizer arrangements.
Figure 4B:
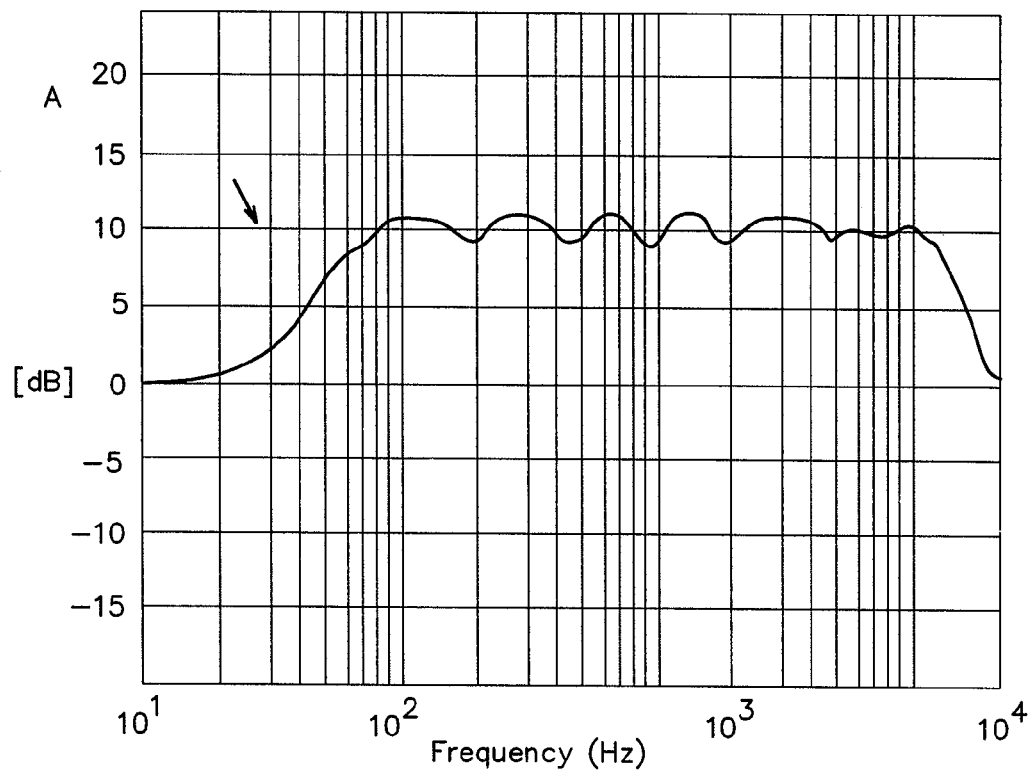
Figure 5A:
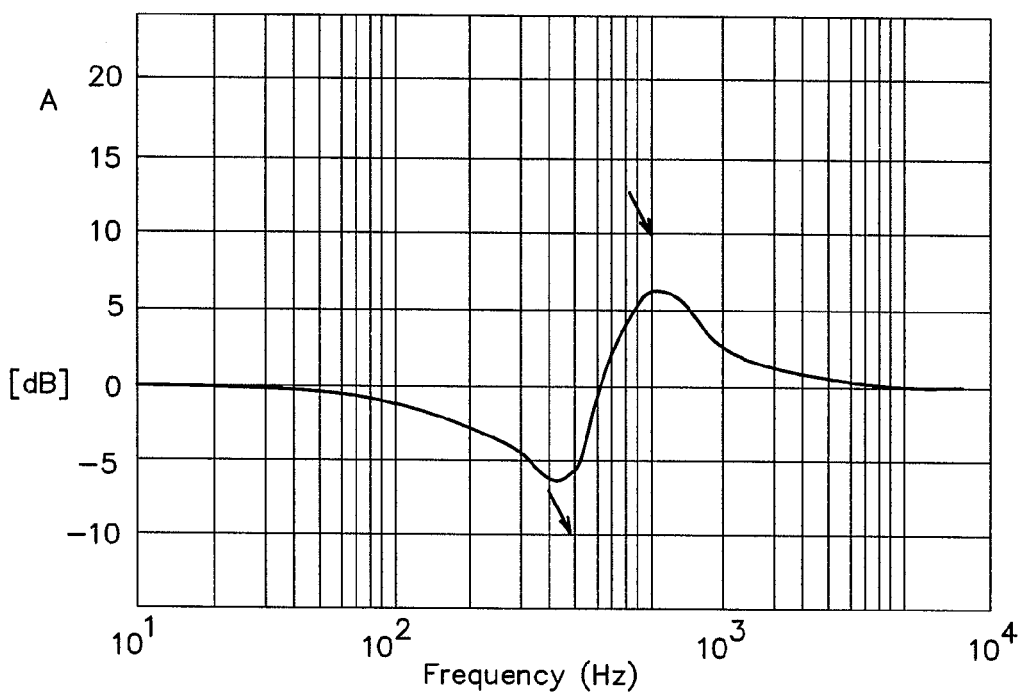
Figure 5B:
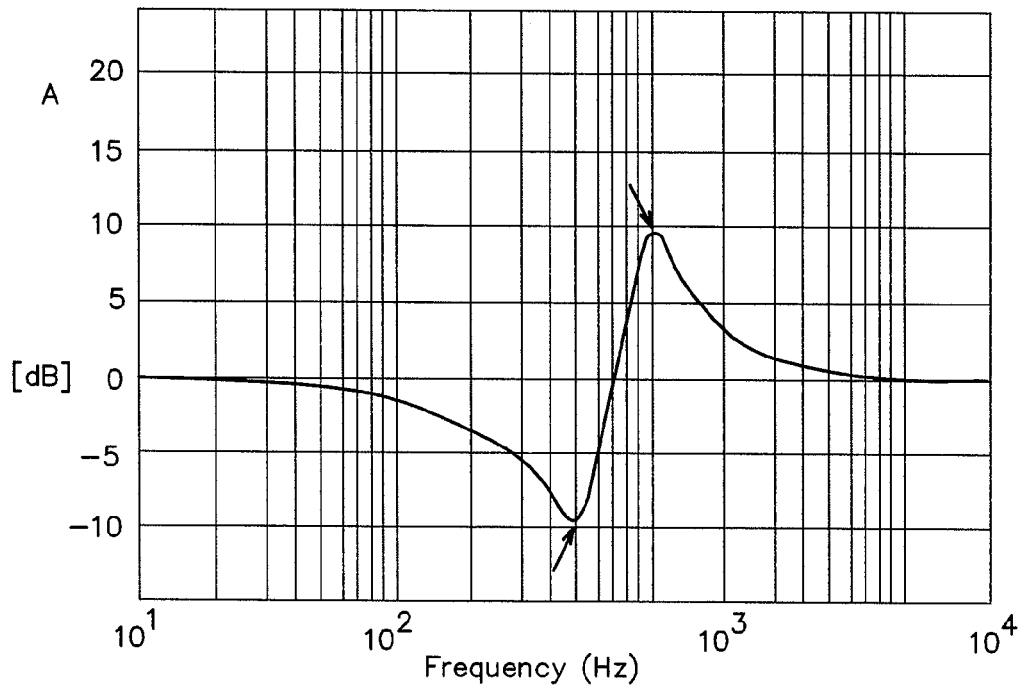
Figure 6A:
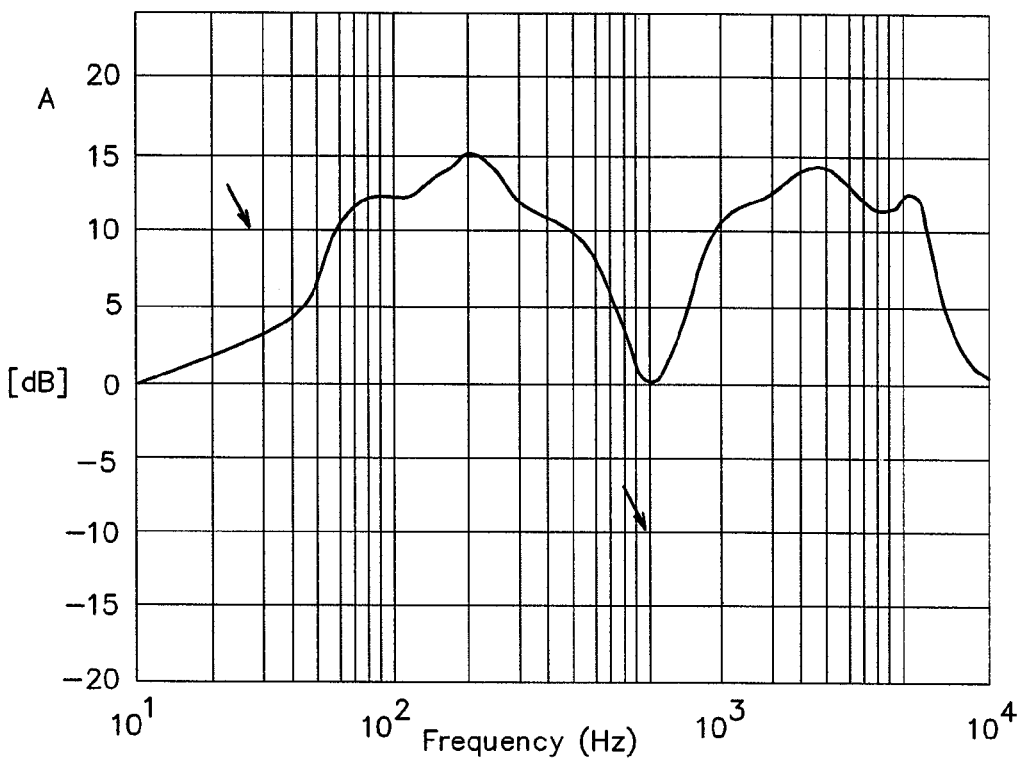
Figure 6B:
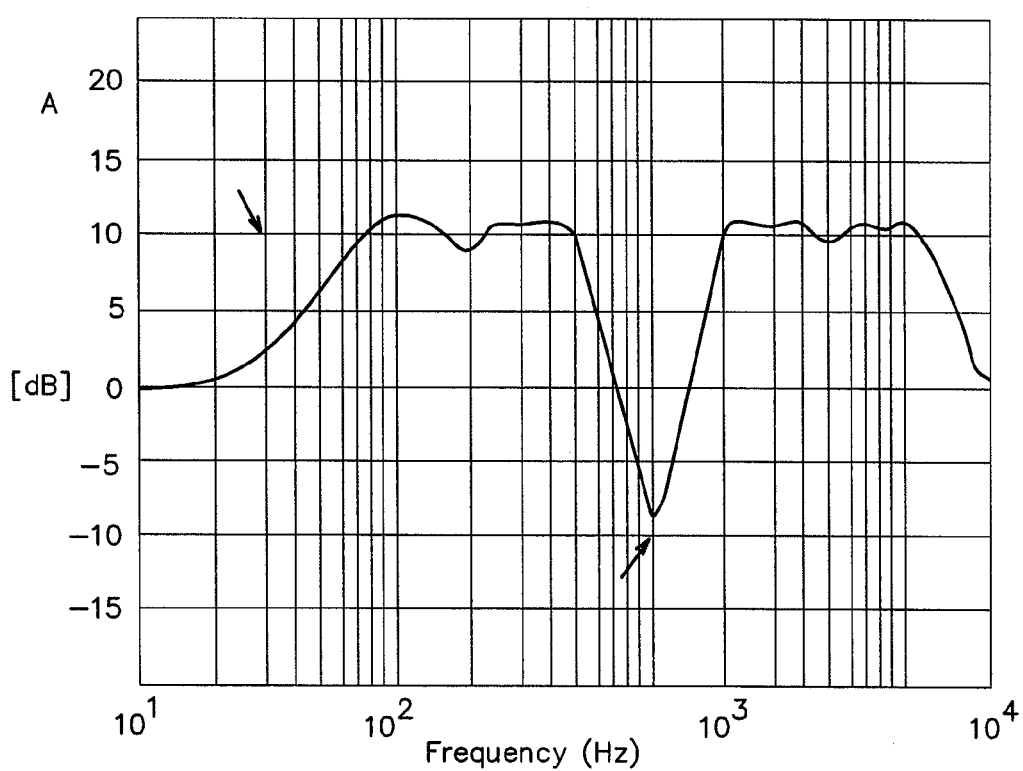

FIGS. 4A, 5A and 6A each show the characteristic curve for an equalizer bank with seven individual equalizer sections without the corresponding equalizers (correction equalizers), while FIGS. 4B, 5B and 6B show this with the corresponding equalizer sections (correction equalizers) according to the invention. The following table shows the base settings in the embodiments of FIGS. 4-6 (the arrows indicate the preset elevations or reductions at the respective center frequencies):

|  | Equalizer | | | | | | |
| --- | --- | --- | --- | --- | --- | --- | --- |
|  | 1 | 2 | 3 | 4 | 5 | 6 | 7 |
| Frequency (Hz) | 80 | 200 | 500 | 1k | 2k | 5k | 12k |
| Gain (dB) In FIG. 4 | +10 | +10 | +10 | +10 | +10 | +10 | +10 |
| Gain (dB) In FIG. 5 | 0 | 0 | −10 | +10 | 0 | 0 | 0 |
| Gain (dB) In FIG. 6 | +10 | +10 | +10 | −10 | +10 | +10 | +10 |

Significant reductions are shown in FIG. 4 for undesired gain peaking, in FIG. 5 for undesired gain reduction, and in FIG. 6 for undesired distortions of the response characteristic. Only the two immediately adjacent equalizer sections are being evaluated, however, in FIGS. 4-6. As a result, peaks of up to 15 dB were compensated.

In the equalizer arrangements shown, methods are employed in which a first equalization of the input signal occurs at, at least two center frequencies with a certain equalization response, and a corresponding second equalization of the input signal occurs at the same at least two center frequencies with a corresponding equalization response compensating interference, where the gain of the respective corresponding equalizations (correction equalizations) at the respective common center frequency contains the negative gain of at least one of the first equalizations adjacent to the corresponding first equalization at the center frequency of the corresponding first equalization. A method of this type may be preferably employed either in an analog or digital signal processor.

Figure 7:
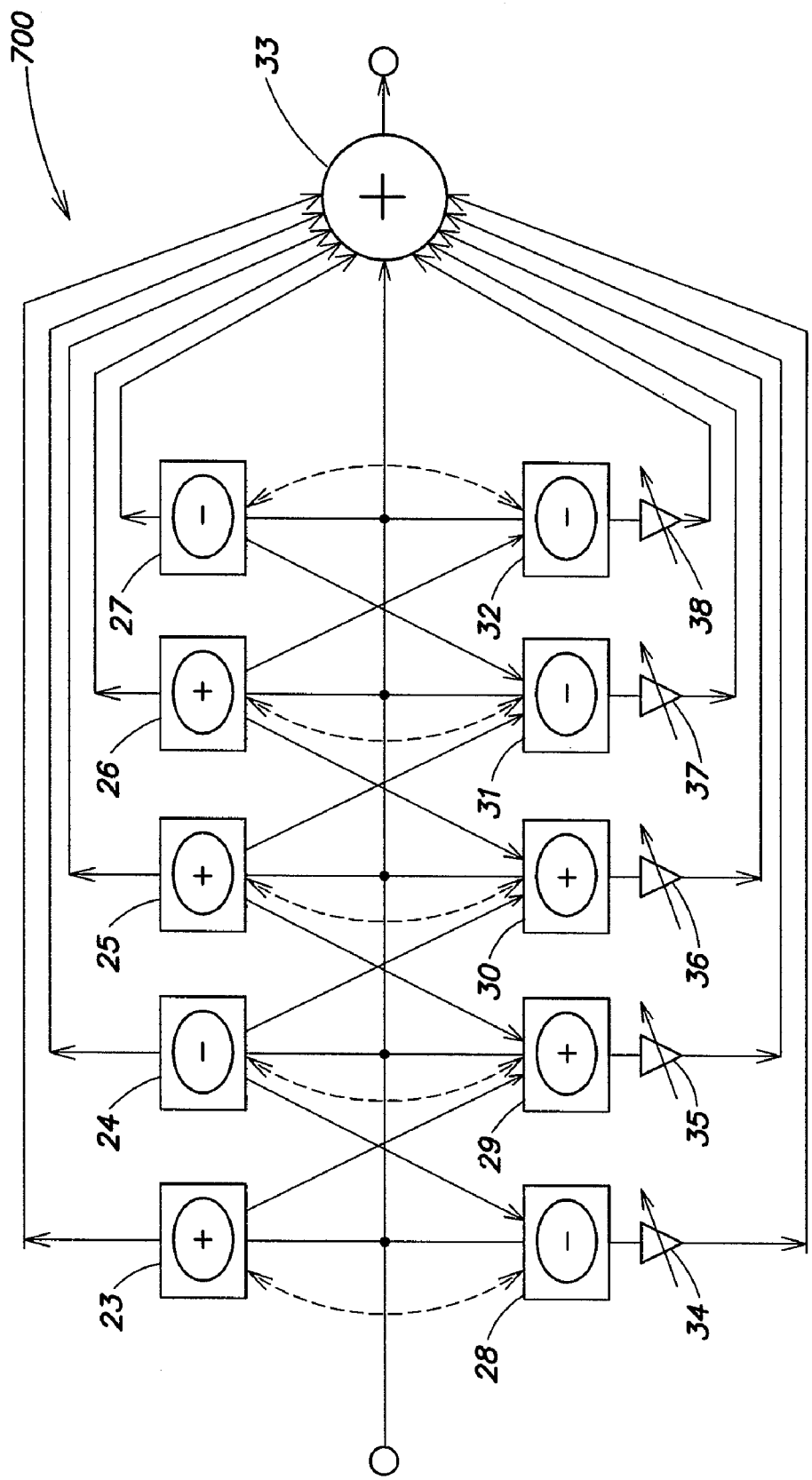
FIG. 7 is a block diagram illustration of a parallel equalizer arrangement configured as a parametric equalizer.

FIG. 7 is a block diagram illustration of a parallel equalizer arrangement 700 configured as a parametric equalizer. A path of constant equalization is maintained from input to output. The gain is equal to one (or 0 dB) in this embodiment. However, it may also have any other value for gain/attenuation. First equalizer sections 23-27 and second equalizer sections 28-32 are preferably bandpass filters with high attenuation below a lower cut-off frequency, high attenuation above an upper cut-off frequency, and variable gain at the center frequency.

The first equalizer sections 23-32 are interconnected on the input side in parallel and coupled with the input of the equalizer arrangement 700. On the output side, all the first equalizer sections 23-32 lead to a summer 33, which provides an equalizer output signal. Connected in series to the second equalizers sections 28-32 are controllable amplifiers 34-38, respectively.

The individual first equalizer section 23-27 may interfere in complex fashion (i.e., the intensity of the interference is a function of the incoming phases). Each first equalizer section corresponds with an associated one of the second equalizer sections 28-32 correcting the interference, such that they have the same center frequency. The total interference effect of adjacent equalizer sections at the center frequency of an individual first equalizer section may be calculated or estimated either simply as a real number (quantity) at approximately the same phase position, or more precisely as a complex number (quantity and phase).

To reduce interference by adjusting the (real) gain of each correcting the second equalizer sections 28-32 in a simple manner without considering phase, the determined gain quantity (real value) is systematically varied as required by the controllable amplifiers 34-38, while the output of each second equalizer section is provided as required with a reverse sign (phase reversal). This approach takes into account, to a certain extent, the phase relationship that was ignored for the sake of simplicity.

One of ordinary skill in the art will recognize that although the present invention has been discussed in the context of certain numbers of first and second equalizer sections, of course the present invention is not so limited. For example, the present invention is not limited to an equalizer having seven first equalizer sections and seven second equalizer sections.

Although the present invention has been shown and described with respect to several preferred embodiments thereof, various changes, omissions and additions to the form and detail thereof, may be made therein, without departing from the spirit and scope of the invention.

What is claimed is:

1. An equalizer arrangement for generating an output signal by equalizing an input signal, comprising:
   a first equalizer section having a first center frequency f1 that receives the input signal and provides a first equalizer output signal to a second equalizer section having a second center frequency f2 that provides a second equalizer output signal;
   a first correcting equalizer section that receives the second equalizer output signal and has a gain at the first center frequency f1 equal to the gain of the second equalizer section at the first center frequency f1 to provide a first correcting equalizer output signal; and
   a second correcting equalizer section that receives the first correcting equalizer output signal and has a gain at the second center frequency value f2 equal to the gain of the first equalizer section at the second center frequency f2 to provide the output signal, where f1 and f2 are different values.

2. An equalizer that receives an input signal, comprising:

a first equalizer, including a first equalizer section having a gain G1 at a first center frequency f1, that receives the input signal and provides a first equalizer output signal to a second equalizer section having a gain G2 at a second center frequency f2, where the second equalizer section provides a second equalizer output signal to a third equalizer section having a gain G3 at a third center frequency f3 that provides a third equalizer output signal; and a second equalizer having a first correcting equalizer section that receives a signal indicative of the third equalizer output signal and provides a first correcting equalizer output signal to a second correcting equalizer section that provides a second correcting equalizer output signal to a third correcting equalizer output section, which provides a third correcting equalizer output signal, where the second correcting equalizer section includes a gain value that is indicative of the negative sum of the gains associated with the first and third equalizer sections at the second center frequency f2.

3. The equalizer of claim 2, where each of the sections of the first and second equalizers includes a bandpass filter.

4. An equalizer that receives an input signal, comprising:

a first equalizer bank, including a first equalizer section having a gain and that receives the input signal and provides a first equalizer output signal to a second equalizer section having a center frequency f2, where the second equalizer section provides a second equalizer output signal, and a third equalizer section that receives the second equalizer output signal and provides a third equalizer output signal; and a second equalizer bank, including a first correcting equalizer section that receives a signal indicative of the third equalizer output signal and provides a first correcting equalizer output signal to a second correcting equalizer section that provides a second correcting equalizer output signal to a third correcting equalizer section that provides an equalizer output signal, where the second correcting equalizer section includes a correction gain value at the center frequency f2 that is indicative of the negative sum of (i) the gain of the first equalizer section at the center frequency f2 and (ii) the gain of third equalizer section at the center frequency f2.

* * * * *